United States Patent
Kuwabara

(10) Patent No.: US 9,490,309 B2
(45) Date of Patent: Nov. 8, 2016

(54) SEMICONDUCTOR DEVICE AND METHOD FOR MANUFACTURING THE SAME

(71) Applicant: Semiconductor Energy Laboratory Co., Ltd., Atsugi-shi, Kanagawa-ken (JP)

(72) Inventor: Hideaki Kuwabara, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/266,886

(22) Filed: May 1, 2014

(65) Prior Publication Data

US 2014/0239302 A1    Aug. 28, 2014

Related U.S. Application Data

(63) Continuation of application No. 12/054,903, filed on Mar. 25, 2008, now Pat. No. 8,716,850.

(30) Foreign Application Priority Data

May 18, 2007  (JP) ................. 2007-133554

(51) Int. Cl.
*H01L 23/10* (2006.01)
*H01L 27/32* (2006.01)

(52) U.S. Cl.
CPC ........... *H01L 27/3258* (2013.01); *H01L 23/10* (2013.01); *H01L 2924/0002* (2013.01); *H01L 2924/12044* (2013.01)

(58) Field of Classification Search
CPC ........... H01L 51/5259; H01L 27/3258; H01L 23/10; H01L 2924/0002; H01L 2924/12044

USPC ...................................................... 257/98, 99
See application file for complete search history.

(56) References Cited

U.S. PATENT DOCUMENTS

| | | | |
|---|---|---|---|
| 4,691,995 A | 9/1987 | Yamazaki | |
| 5,411,919 A | 5/1995 | Inada | |
| 6,391,742 B2 | 5/2002 | Kawai | |
| 6,555,901 B1 | 4/2003 | Yoshihara | |
| 6,724,150 B2 | 4/2004 | Maruyama | |
| 6,818,479 B2 | 11/2004 | Boroson et al. | |
| 6,876,145 B1 | 4/2005 | Yamazaki | |
| 7,091,605 B2 | 8/2006 | Boroson et al. | |
| 7,169,636 B2 * | 1/2007 | Maruyama et al. | ........... 438/99 |

(Continued)

FOREIGN PATENT DOCUMENTS

| | | |
|---|---|---|
| EP | 1296385 A | 3/2003 |
| JP | 10-019923 A | 1/1998 |

(Continued)

*Primary Examiner* — Latanya N Crawford
(74) *Attorney, Agent, or Firm* — Fish & Richardson P.C.

(57) ABSTRACT

An object is to realize a hermetically sealed package which ensures long-term airtightness inside the package by sealing using a substrate, or a sealing structure for reducing destruction caused by pressure from the outside. A frame of a semiconductor material is provided over a first substrate, which is bonded to a second substrate having a semiconductor element so that the semiconductor element is located inside the frame between the first substrate and the second substrate. The frame may be formed using, as frame members, two L-shaped semiconductor members in combination or four or more stick semiconductor members in combination.

18 Claims, 8 Drawing Sheets

(56) References Cited

U.S. PATENT DOCUMENTS

| | | |
|---|---|---|
| 7,346,981 B2 | 3/2008 | Borwick |
| 7,598,103 B2 | 10/2009 | Hong |
| 7,651,877 B2 | 1/2010 | Izumi |
| 7,780,493 B2 | 8/2010 | Choi |
| 7,841,919 B2 | 11/2010 | Lee |
| 7,871,949 B2 | 1/2011 | Lee |
| 7,948,175 B2 * | 5/2011 | Kurihara .................. 313/512 |
| 7,999,372 B2 | 8/2011 | Park |
| 8,063,561 B2 | 11/2011 | Choi |
| 2003/0092243 A1 | 5/2003 | Hirschfeld |
| 2004/0121602 A1 * | 6/2004 | Maruyama et al. .......... 438/689 |
| 2004/0152392 A1 * | 8/2004 | Nakamura .................... 445/25 |
| 2004/0189554 A1 | 9/2004 | Russ |
| 2005/0040762 A1 * | 2/2005 | Kurihara .................. 313/512 |
| 2005/0046778 A1 | 3/2005 | Hsiao |
| 2005/0070035 A1 * | 3/2005 | Yazaki ............... B23K 26/032 438/22 |
| 2005/0084201 A1 | 4/2005 | Akashi |
| 2005/0164470 A1 | 7/2005 | Yamazaki |
| 2006/0009251 A1 | 1/2006 | Noda |
| 2006/0011288 A1 | 1/2006 | Watanabe |
| 2006/0022219 A1 | 2/2006 | Humbs |
| 2006/0119780 A1 | 6/2006 | Baek |
| 2006/0267016 A1 | 11/2006 | Ahn |
| 2006/0281227 A1 | 12/2006 | Yang |
| 2007/0062285 A1 | 3/2007 | Yamaguchi |
| 2007/0072392 A1 | 3/2007 | Ooseki |
| 2007/0096096 A1 * | 5/2007 | Kuwabara ......... G02F 1/136286 257/59 |
| 2007/0170855 A1 | 7/2007 | Choi |
| 2007/0171637 A1 | 7/2007 | Choi |
| 2007/0172971 A1 * | 7/2007 | Boroson ...................... 438/26 |
| 2007/0176176 A1 | 8/2007 | Yamazaki |
| 2007/0176563 A1 | 8/2007 | Kim |
| 2007/0205721 A1 | 9/2007 | Son |
| 2007/0267648 A1 | 11/2007 | Hwang |
| 2007/0275505 A1 | 11/2007 | Wolterink |
| 2008/0049157 A1 | 2/2008 | Kim |
| 2008/0188023 A1 | 8/2008 | Shin |
| 2008/0203904 A1 | 8/2008 | Kim |
| 2009/0273072 A1 | 11/2009 | Nakada |
| 2009/0279012 A1 * | 11/2009 | Kuwabara ......... G02F 1/136286 349/46 |

FOREIGN PATENT DOCUMENTS

| | | |
|---|---|---|
| JP | 11-045778 A | 2/1999 |
| JP | 2000-150916 A | 5/2000 |
| JP | 2003-017726 A | 1/2003 |
| JP | 2003-179174 A | 6/2003 |
| JP | 2005-062278 A | 3/2005 |
| JP | 2005-112676 A | 4/2005 |
| JP | 2006-080297 A | 3/2006 |
| JP | 2006-178301 A | 7/2006 |
| JP | 2006-237145 A | 9/2006 |
| JP | 2007-087620 A | 4/2007 |
| JP | 2007-140061 A | 6/2007 |
| JP | 2007-322271 A | 12/2007 |
| WO | WO 2006/046434 A1 | 5/2006 |

* cited by examiner

SEMICONDUCTOR DEVICE AND METHOD FOR MANUFACTURING THE SAME

CROSS-REFERENCE TO RELATED APPLICATIONS

This application is a continuation of U.S. application Ser. No. 12/054,903, filed Mar. 25, 2008, now allowed, which claims the benefit of a foreign priority application filed in Japan as Serial No. 2007-133554 on May 18, 2007, both of which are incorporated by reference.

BACKGROUND OF THE INVENTION

1. Field of the Invention

The present invention relates to a semiconductor device having a circuit including thin film transistors (hereinafter referred to as TFTs) and a manufacturing method of the semiconductor device. For example, the present invention relates to an electro-optical device typified by a liquid crystal display panel, a light-emitting display device having organic light-emitting elements, a plasma display device, and an electronic device having an optical module or a wireless chip as a component.

Note that "semiconductor device" used in this specification refers to devices in general that can operate by utilizing semiconductor characteristics, and an electro-optical device, a semiconductor circuit, and an electronic device are all included in the semiconductor device.

2. Description of the Related Art

In recent years, much attention has been given to a technique for forming thin film transistors (TFTs) using a semiconductor thin film (with a thickness of approximately several to several hundred nanometers) which is formed over a substrate having an insulating surface. Thin film transistors have been widely applied to electronic devices such as ICs and electro-optical devices, and their development especially as switching elements for an image display device has been accelerated.

As image display devices, liquid crystal display devices have been known. Active-matrix liquid crystal display devices have been commonly used because they can provide images with higher definition than passive-matrix liquid crystal display devices. In an active-matrix liquid crystal display device, display patterns are formed on a screen by driving of pixel electrodes that are arranged in a matrix. Specifically, voltage is applied between a selected pixel electrode and a counter electrode corresponding to the pixel electrode, and thus, a liquid crystal layer located between the pixel electrode and the counter electrode is optically modulated. This optical modulation is recognized as a display pattern by a viewer.

The present applicant has proposed liquid crystal dropping in Reference 1 (U.S. Pat. No. 4,691,995).

In recent years, light-emitting devices having EL elements as self light-emitting elements have been researched actively, and in particular, light-emitting devices using an organic material as an EL material have attracted attention. These light-emitting devices are also called EL displays.

A phenomenon in which light emission occurs when an electric field is applied to a substance is referred to as an electroluminescence (EL) phenomenon, which is a known phenomenon. In particular, inorganic EL using an inorganic thin film of ZnS:Mn and organic EL using an organic thin film formed by evaporation are bright, exhibit EL emission with high efficiency, and are attempted to be applied to displays.

The luminescence of an organic compound includes light emission (fluorescence) upon returning to a ground state from a singlet-excited state and light emission (phosphorescence) upon returning to a ground state from a triplet-excited state. Light-emitting devices manufactured using a film formation apparatus and a film formation method of the present invention can be applied to cases where they perform either light emission.

Light-emitting devices are of a self light-emitting type, unlike liquid crystal display devices; therefore, a feature of the light-emitting devices is that they have no problem with viewing angle. That is, light-emitting devices are more suitable displays for outdoor use than liquid crystal displays, and a variety of applications have been proposed.

In addition, light-emitting elements each including a cathode, an EL layer, and an anode are called EL elements, which include two types: one is that in which an EL layer is formed between two kinds of stripe electrodes that are arranged at right angles to each other (simple-matrix type), and the other is that in which TFTs are provided and an EL layer is formed between pixel electrodes and counter electrodes that are arranged in a matrix (active-matrix type). However, when pixel density is increased, it is thought that the active-matrix type where each pixel (or each dot) is provided with a switch be advantageous because the active-matrix type can be driven at lower voltage.

An EL material forming an EL layer deteriorates very easily and deteriorates by easily oxidizing or absorbing moisture under the presence of oxygen or water. Therefore, there are problems in that the luminance of light emission and the lifetime of a light-emitting element decrease. Thus, by covering of a light-emitting element with a sealing can, enclosure of dry air inside the sealing can, and attachment of a drying agent, oxygen or moisture is prevented from reaching the light-emitting element.

The present applicant has also proposed, in Reference 2 (U.S. Pat. No. 6,724,150), that a light-emitting device is provided with a drying agent in a depression in a sealing substrate.

In addition, the present applicant has proposed, in Reference 3 (U.S. Pat. No. 6,876,145), that a semiconductor substrate is used for a light-emitting device.

SUMMARY OF THE INVENTION

In a conventional sealing technique, a sealant that is an organic material is used to bond a pair of substrates. Materials of sealants are developed for a variety of applications; for example, a sealant for a liquid crystal injection method, a sealant for a liquid crystal dropping method, a sealant for organic EL, and the like are used for respective display panels. Each of the sealants is an organic material.

Furthermore, in recent years, long-term reliability and durability of semiconductor devices have been demanded, which may be constrained by reliability and durability of a sealant that is an organic material.

There is a technique by which scaling is performed using a high-strength ceramic substrate, but processing of a ceramic substrate, such as cutting or thinning, is difficult and accordingly it is difficult to obtain a desired shape, for example, a dimension or a thickness. In addition, a ceramic substrate does not transmit light; therefore, it cannot be used for sealing of a light-receiving sensor, a liquid crystal display device, a plasma display device, or the like. Moreover, because of its high heat resistance, if a ceramic substrate with low thermal expansion coefficient is bonded with an adhesive to a glass substrate or the like where elements are formed, there is possibility that the adhesion between the substrates may be decreased due to a large difference in thermal expansion coefficient.

It is an object of the present invention to realize a hermetically sealed package which ensures long-term airtightness inside the package by sealing using a substrate, but not a ceramic substrate. It is another object of the present invention to realize a sealing structure for reducing destruction caused by pressure from the outside.

It is still another object to provide a sealing structure for preventing the intrusion of an impurity such as moisture. It is yet another object to provide a structure for improving the reliability of a wireless chip against pressure from the outside. It is still yet another object to provide a structure of a wireless chip that is resistant to bending.

The present invention is intended to achieve the aforementioned objects through a reduction in usage of, or preferably elimination of the use of, a sealant that is an organic material in a hermetically sealed package.

In a hermetically sealed package, a first substrate is provided with a frame of a semiconductor material, which is bonded to a second substrate that has a semiconductor element, whereby the first substrate and the second substrate are bonded together so that the semiconductor element is located inside the frame to ensure airtightness inside the frame.

The first substrate may be provided with the frame of a semiconductor material by a separation method by hydrogen ion irradiation (a hydrogen ion implantation separation method) or the like, but the present invention is not particularly limited thereto. The separation method by hydrogen ion irradiation refers to a method in which a semiconductor substrate is irradiated with hydrogen ions to form a hydrogen-containing layer, which serves as a separation layer, in the semiconductor substrate and is then fixed to another substrate, and heat treatment or the like is lastly performed to separate one part of the semiconductor substrate from the other within the hydrogen-containing layer or at the interface thereof and to form a single-crystal semiconductor layer over the fixed substrate. In the separation method by hydrogen ion irradiation, the thickness of a single-crystal semiconductor layer to be obtained is determined by the position of a hydrogen-containing layer formed in a semiconductor substrate. Thus, the separation method by hydrogen ion irradiation is suitable for cases where a frame that maintains the distance between a pair of substrates, that is, a single-crystal semiconductor layer is formed to be thin. The frame is formed using a single-crystal semiconductor substrate or a polycrystalline semiconductor substrate. As a single-crystal semiconductor substrate, a semiconductor wafer of silicon, germanium, or the like, a compound semiconductor wafer of gallium arsenide, indium phosphide, or the like, or the like can be used. The semiconductor substrate has a thickness of about 0.5 mm to 1.5 mm. Depending on the distance between the substrates, the semiconductor substrate may be thinned by grinding to less than 0.5 mm. Although the frame may be formed by being cut out from the semiconductor substrate, it is preferable that a semiconductor substrate and a first substrate be bonded together and one part of the semiconductor substrate be separated from the other by a separation method by hydrogen ion irradiation, and a single-crystal semiconductor layer over the first substrate which is obtained by the separation be patterned. When cleaned surfaces are located in contact with each other, a bond is formed by attraction between the surfaces; therefore, a bond can be formed at room temperature. In order to increase bonding strength, it is preferable that a bonding layer which has a smooth surface and forms a hydrophilic surface be provided in a portion where bonding is intended. In order to obtain a smooth surface, a planarization process may be performed with an apparatus using chemical mechanical polishing (hereinafter referred to as CMP) or the like. It is preferable that a bonding layer of the first substrate and a bonding layer of the second substrate be located in contact with each other and bonded together at room temperature.

In order to further increase adhesion strength of the bonding, heat treatment may be performed. In the case where treatment for making a surface hydrophilic is performed to form a bonding layer, hydroxyl groups on the surfaces act to form a bond by hydrogen bonding. If the cleaned surfaces that are located in contact with each other and bonded together are heated at room temperature or higher, bonding strength can further be increased. When a glass substrate is used as the first substrate that has a light-transmitting property, the heating for increasing bonding strength is performed at a temperature lower than the strain point of the substrate. In addition, heating may be performed using a halogen lamp or the like, or partial heating may be performed by scanning with laser light.

One aspect of the present invention disclosed in this specification is a semiconductor device which includes a first substrate, a second substrate, a semiconductor element over the first substrate, and a semiconductor member between the first substrate and the second substrate. The semiconductor element is sealed using the first substrate, the second substrate, and the semiconductor member, and the distance between the first substrate and the second substrate is maintained by the semiconductor member.

According to the above aspect, the semiconductor device further includes a first bonding layer of an inorganic insulating material between the semiconductor member and the first substrate. With the use of the first bonding layer of an inorganic insulating material, the semiconductor member and the first substrate can be firmly fixed to each other even if an adhesive material such as a sealant is not used. In addition, the semiconductor device includes a second bonding layer of an inorganic insulating material between the semiconductor member and the second substrate. With the use of the second bonding layer of an inorganic insulating material, the semiconductor member and the second substrate can be firmly fixed to each other even if an adhesive material such as a sealant is not used. The semiconductor member and at least one of the first substrate and the second substrate are bonded together.

In addition, according to the above aspect, the semiconductor member has a frame shape, and the semiconductor element is sealed in a space surrounded by the semiconductor member, the first substrate, and the second substrate. The semiconductor member having a frame shape also functions as a spacer for maintaining the distance between the first substrate and the second substrate.

The frame is preferably formed from a single semiconductor substrate into a loop, in that sealing is possible without use of any sealant. However, the frame may be formed using, as frame members, two L-shaped semiconductor members in combination or four or more stick semiconductor members in combination. When a plurality of semiconductor members is used as the frame, a sealant is used in a connecting portion between the frame members. Even if a sealant is partly used in a connecting portion between the frame members, a portion where a sealant is used is significantly smaller than before. Therefore, it is possible to further prevent the intrusion of an impurity such as moisture and to further improve reliability compared to a conventional sealing structure.

Another aspect of the present invention is a semiconductor device which includes a first substrate, a second substrate, a semiconductor element over the first substrate, and a plurality of semiconductor members between the first substrate and the second substrate. The semiconductor element is sealed using the first substrate, the second substrate, and the plurality of semiconductor members, and the distance between the first substrate and the second substrate is maintained by the plurality of semiconductor members.

According to the above aspect, each of the plurality of semiconductor members has a stick shape or an L shape, and the semiconductor element is sealed in a space surrounded by the plurality of semiconductor members, the first substrate, and the second substrate. A wireless chip, an optical sensor, or the like does not necessarily need to be hermetically sealed except when an organic material is used, such as for an organic memory or the like in a wireless chip. In a semiconductor element such as a wireless chip or an optical sensor, a space between a pair of substrates does not necessarily need to be a hermetic space, and the plurality of semiconductor members is made to function as a spacer for maintaining the distance between the pair of substrates. In the present invention, in order to protect a semiconductor element such as a wireless chip or an optical sensor from impact or the like from the outside, the semiconductor element such as a wireless chip or an optical sensor is placed between a pair of substrates.

Another aspect of the present invention is a semiconductor device which includes a first substrate, a second substrate, a semiconductor circuit over the first substrate, and a plurality of semiconductor members between the first substrate and the second substrate. The plurality of semiconductor members is placed around the semiconductor circuit.

According to the above aspect, if an antenna that is electrically connected to the semiconductor circuit is provided over the first substrate, the semiconductor circuit can communicate using wireless signals. A portion where the antenna and the semiconductor circuit are electrically connected to each other is sensitive to pressure or the like from the outside, and the connection may be destroyed by application of some force. The connection can withstand impact from the outside if the antenna is protected by the first substrate and the second substrate. Even if a fragile material such as glass is used for the first substrate or the second substrate, the plurality of semiconductor members can distribute pressure that is applied to one of the substrates; thus, overall strength can be increased compared to the case where a semiconductor circuit and an antenna are formed over a single substrate so as to be exposed without the use of a pair of substrates. When a flexible material such as a resin is used for the first substrate or the second substrate, by placement of the plurality of semiconductor members around the semiconductor circuit, bending of the substrate can be partially suppressed, and in particular, the connecting portion between the antenna and the semiconductor circuit can be protected. Because each semiconductor member is hard to bend, it functions as a skeletal member (reinforcing member). The distance between the first substrate and the second substrate is maintained by the semiconductor members.

According to each of the above aspects, the semiconductor device further includes a first bonding layer of an inorganic insulating material between the semiconductor member and the first substrate. In addition, the semiconductor device includes a second bonding layer of an inorganic insulating material between the semiconductor member and the second substrate. With the use of the bonding layer of an inorganic insulating material, bonding to the substrate is achieved with a simple structure. This simple structure is a structure in which at least the first bonding layer, the semiconductor member, the second bonding layer, and the second substrate are stacked in this order over the first substrate.

When an active-matrix display device using a semiconductor element in a pixel portion is manufactured, one aspect of the present invention for achieving the above aspects is a method for manufacturing a semiconductor device, in which one surface of a semiconductor member is bonded to a first substrate that has a light-transmitting property, a pixel portion including a semiconductor element is formed over a second substrate, the other surface of the semiconductor member is bonded to the second substrate to seal the pixel portion in a space surrounded by the semiconductor member, the first substrate, and the second substrate.

According to the manufacturing method of the above aspect, the pixel portion and the semiconductor member are placed so as not to overlap with each other, and the semiconductor member is placed around the pixel portion.

According to each of the above aspects, the semiconductor member is a single-crystal semiconductor member, preferably, a single-crystal silicon member. In the semiconductor element, a semiconductor layer which serves as an active layer is used, and one of causes for deterioration of the semiconductor element is considered to be the intrusion of an impurity from the outside (particularly, an alkali metal such as Na or K). By placement of a single-crystal semiconductor member around the semiconductor element, an impurity from the outside is made to intrude preferentially into the single-crystal semiconductor member and to be retained in the single-crystal semiconductor member; accordingly, the intrusion of an impurity into the semiconductor layer of the semiconductor element is prevented. By prevention of the intrusion of an impurity into the semiconductor layer of the semiconductor element, the long-term reliability of the semiconductor device is improved. In addition, a material of the single-crystal semiconductor member placed around the semiconductor element can be of a lower grade than that of the semiconductor layer used for the semiconductor element; thus, the semiconductor member can be manufactured at low cost.

The present invention can also be used for a package of a plasma display device.

The present invention can be used for not only display devices but also a variety of hermetically sealed packages. For example, the present invention may be used for hermetic sealing of an infrared remote control receiver module or for a sealing shield of a high-frequency semiconductor element such as a SAW filter.

Because the present invention can achieve highly hermetic packaging with the use of a glass substrate as a sealing substrate, the present invention is most suitable for a semiconductor module in which light is transmitted through a sealing substrate. When a glass substrate is used, a glass substrate can be processed more easily than a ceramic substrate. Therefore, an unnecessary portion can be cut off after a sealing substrate is attached, which leads to a reduction in the size of a module. In addition, the semiconductor member can be made to function as a spacer for maintaining the distance between the first substrate and the second substrate; thus, the semiconductor circuit can be protected.

DETAILED DESCRIPTION OF THE INVENTION

Embodiment modes of the present invention will be described below.

Embodiment Mode 1

Figure 1A:
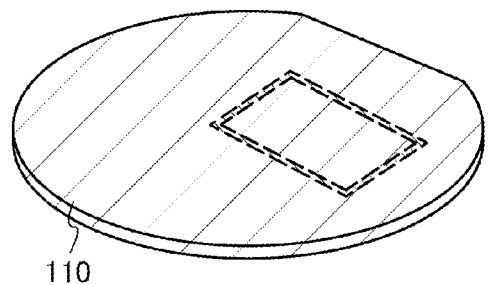
FIGS. 1A to 1C are perspective views and FIG. 1D is a cross-sectional view showing a manufacturing process of a semiconductor device.

First, a single-crystal silicon substrate 110 is prepared (FIG. 1A). Note that not only a single-crystal silicon substrate but also a single-crystal silicon germanium substrate or the like may be used. The single-crystal silicon substrate 110 has, for example, a disk shape of 120 mm to 300 mm in diameter.

Figure 1B:
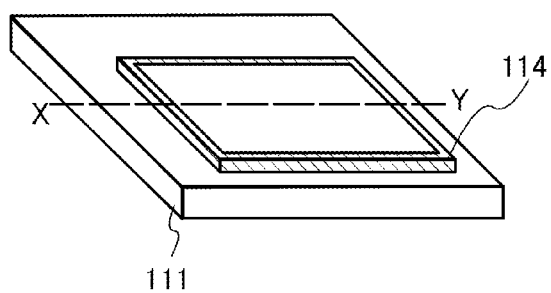

Next, a member to be a frame is taken out of the single-crystal silicon substrate 110, and a first substrate 111 having a light-transmitting property is provided with a frame 114 of a semiconductor material (FIG. 1B). The first substrate having a light-transmitting property may be provided with the frame of a semiconductor material by a separation method by hydrogen ion irradiation or the like, but the present invention is not particularly limited thereto. The frame is formed using a single-crystal semiconductor substrate or a polycrystalline semiconductor substrate. The frame may be formed by being cut out from a semiconductor substrate, but the frame is preferably formed by a separation method by hydrogen ion irradiation.

FIGS. 2A to 2E show an example in which the frame is formed using a separation method by hydrogen ion irradiation.

Figure 2A:
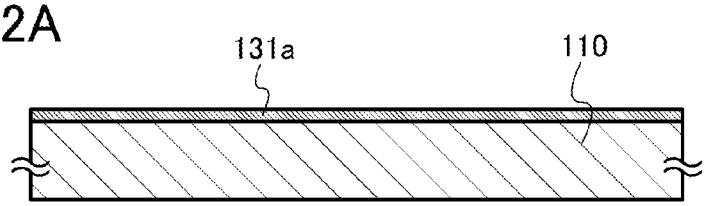
FIGS. 2A to 2E are cross-sectional views showing a manufacturing process of a semiconductor device.

A first nitrogen-containing silicon oxide film (hereinafter referred to as a first SiON film) 131a is formed over the single-crystal silicon substrate 110 (FIG. 2A). The thickness may be appropriately determined by a practitioner and may be set to be 10 nm to 500 nm (preferably, 20 nm to 50 nm). The first SiON film 131a serves as a member of the frame later. Note that the first SiON film 131a can be formed by a method like a CVD method such as a plasma CVD method or a low pressure CVD method, a sputtering method, or the like. Note that the first SiON film 131a can be formed on the single-crystal silicon substrate 110 by treatment of the surface of the single-crystal silicon substrate with oxygen radicals (which may include OH radicals) that are generated by plasma discharge in an oxygen-containing gas atmosphere and by treatment of the surface of the single-crystal silicon substrate with nitrogen radicals (which may include NH radicals) that are generated by plasma discharge in a nitrogen-containing atmosphere. Accordingly, the bonding strength of the single-crystal silicon substrate 110 in being bonded to a sealing substrate later can be increased.

Note that the first SiON film 131a does not necessarily need to be provided, and a single-crystal silicon substrate in which a hydrogen-containing layer is formed by introduction of hydrogen may be used. Instead of the SiON film, a silicon oxide film may be formed by a chemical vapor deposition (CVD) method or a plasma chemical vapor deposition (plasma CVD) method using a mixed gas of a TEOS gas and an oxygen gas. Alternatively, a substrate may be used in which an SiON film and an oxygen-containing silicon nitride film (hereinafter referred to as an SiNO film) are sequentially stacked over a single-crystal silicon substrate, a hydrogen-containing layer is formed in the single-crystal silicon substrate by partial introduction of hydrogen, and a silicon oxide film is then formed over the SiNO film by a CVD method or a plasma CVD method using a mixed gas of a TEOS gas and an oxygen gas. Still alternatively, an SiON film, an SiNO film, and a silicon oxide film formed by a CVD method or a plasma CVD method using a mixed gas of a TEOS gas and an oxygen gas may be sequentially stacked over a single-crystal silicon substrate, and a hydrogen-containing layer may be formed in the single-crystal silicon substrate by partial introduction of hydrogen. Note that, when a silicon oxide film is formed by a CVD method or a plasma CVD method using a mixed gas of a TEOS gas and an oxygen gas, the thickness of the silicon oxide film is preferably in the range of 40 nm to 800 nm.

Note that a TEOS gas here refers to a tetraethylorthosilicate gas. If the silicon oxide film formed by a CVD method or a plasma CVD method using a mixed gas of a TEOS gas and an oxygen gas is provided at the bonding interface between the single-crystal silicon substrate and a sealing substrate, adhesion between the substrates can be increased.

Note that, when the first SiON film 131a is not formed over the single-crystal silicon substrate, a natural oxide film, a chemical oxide, or an ultrathin oxide film which is formed by UV light irradiation in an oxygen-containing atmosphere is preferably formed on the surface of the single-crystal silicon substrate. Here, a chemical oxide can be formed by treatment of the surface of the single-crystal silicon substrate with an oxidizing agent such as ozone water, hydrogen peroxide water, or sulfuric acid. If an oxide film is formed over the single-crystal silicon substrate, the surface of the single-crystal silicon substrate can be prevented from being etched in introducing hydrogen later.

Figure 2B:
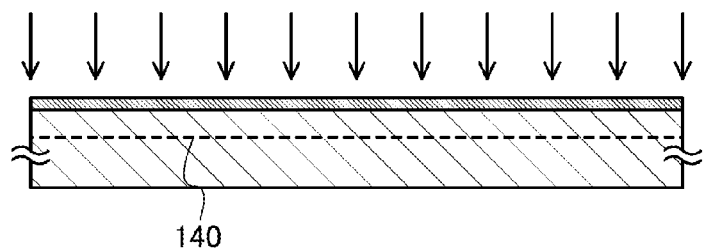

Next, hydrogen is introduced into the single-crystal silicon substrate 110 from the first SiON film 131a side through the first SiON film 131a to form a hydrogen-containing layer 140 (FIG. 2B). Alternatively, the hydrogen-containing layer 140 may be formed by introduction of hydrogen into the single-crystal silicon substrate 110 from a side opposite to arrows shown in FIG. 2B. Note that the depth at which the hydrogen-containing layer 140 is formed (the distance between the hydrogen-containing layer 140 and the interface between the single-crystal silicon substrate 110 and the first SiON film 131a) corresponds to the thickness of a single-crystal silicon layer which functions as a part of a spacer for maintaining the distance between substrates later.

For example, irradiation with hydrogen ions can be performed by an ion implantation method using a mass-separation ion implantation apparatus at a dose of $1\times10^{16}$ atoms/cm$^2$ to $1\times10^{17}$ atoms/cm$^2$ so that a single-crystal silicon layer with a thickness of 100 nm is left remaining between the surface of the single-crystal silicon substrate 110 and the hydrogen-containing layer 140. Alternatively, irradiation with hydrogen ions may be performed using a non-mass-separation ion doping apparatus with $H_3^+$ ions used as a main ion species. When an ion doping apparatus is used, by use of $H_3^+$ as hydrogen ions, the length of time it takes to perform irradiation can be decreased.

Note that, in this embodiment mode, a process for planarizing the surface of the first SiON film 131a may be performed. For example, the surface of the SiON film can be planarized by a polishing process called chemical mechanical polishing (CMP). By planarization of the surface of the SiON film, the adhesion thereof to a sealing substrate to be bonded later can be increased.

Next, the first SiON film 131a formed over the single-crystal silicon substrate 110 is irradiated with an argon ion beam in a vacuum to place atoms on the surface in an active state where chemical bond is easily formed. Here, the first SiON film 131a can be placed in an active state by collision of argon ions, which are generated by plasma discharge in an argon gas atmosphere, with the surface of the first SiON film 131a. Note that the surface can be placed in an active state by exposure to not only an argon ion beam but also a plasma atmosphere, X-rays, or an electron beam. A gas used for exposure to a plasma atmosphere can be oxygen, nitrogen, hydrogen, an inert gas such as argon or helium, a molecular gas such as ammonia, or the like. Note that the energy for irradiation of the substrate at that time is preferably controlled to be a DC bias of from approximately several volts to 400 volts. Still alternatively, the surface may be placed in an active state by exposure to an atmosphere of ions with an energy equal to or higher than 20 eV and lower than 200 eV.

Figure 2C:
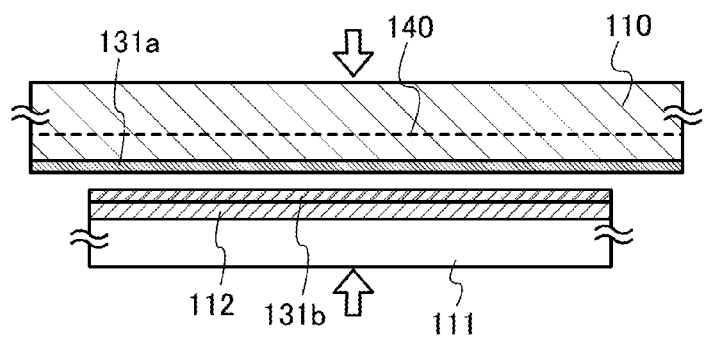

Next, the single-crystal silicon substrate 110 and a first substrate 111 having a light-transmitting property, which is separately prepared and serves as a sealing substrate, are bonded together. In this embodiment mode, a glass substrate is used as the first substrate, on the surface of which a first oxygen-containing silicon nitride (SiNO) film 112 and a second nitrogen-containing silicon oxide (SiON) film 131b are sequentially formed (FIG. 2C). Note that, in a similar manner to the surface of the single-crystal silicon substrate, the surface of the second SiON film 131b may be activated. Note that the first SiNO film 112 or the second SiON film 131b does not necessarily need to be provided on the first substrate 111. Alternatively, a glass substrate over which a silicon oxide film is formed by a CVD method or a plasma CVD method using a mixed gas of a TEOS gas and an oxygen gas may be used. Still alternatively, a glass substrate on the surface of which no insulating layer is formed may be used. In that case, it is preferable that the surface of the glass substrate be cleaned.

In this embodiment mode, a chemical bond is formed at the interface between the first SiON film 131a and the second SiON film 131b by contact of the surfaces thereof with each other and by bonding thereof; thus, a third SiON film 131 where the first SiON film 131a and the second SiON film 131b are bonded together is formed.

In this embodiment mode, by irradiation of the substrate surface with an argon ion beam or the like in a vacuum, an adsorption gas, a natural oxide film, or the like which is present on the substrate surface can be etched; a bonding force for the bonding can be given to the substrate surface; and two substrates can be bonded together by superposition thereof on each other. An interatomic bond is formed at the interface between the substrates that are bonded together as described above, and a firm bond can be formed without any heat treatment.

Note that, instead of the glass substrate, a plastic substrate which can withstand a temperature for heat treatment in a later process may be used, or a film-like flexible substrate may be used. As a plastic substrate, a substrate formed of polyamide such as polyethylene terephthalate (PET), polyethylene naphthalate (PEN), polyether sulfone (PES), nylon 6, or nylon 66 may be used, and as a flexible substrate, a synthetic resin such as acrylic can be used. As the other substrate, an adhesive synthetic film of polyolefin such as PE or PP, an acrylic synthetic resin, an epoxy synthetic resin, or the like may be used. An adhesive synthetic film can be fixed by heat pressure bonding. Alternatively, a resin substrate containing an inorganic material, for example, an HT substrate (manufactured by Nippon Steel Chemical Co., Ltd.) with a Tg of 400° C. or higher may be used. Still alternatively, a highly heat-resistant substrate such as a quartz substrate or a crystallized glass substrate may be used. Note that, because a ceramic substrate has low surface planarity, it cannot be bonded to the single-crystal silicon substrate later and cannot be used in place of the glass substrate.

Note that the first SiNO film 112 and the second SiON film 131b which are formed over the first substrate 111 each function as a blocking layer and can prevent the diffusion of an impurity from the glass substrate. It is particularly effective to provide a blocking layer because the glass substrate contains ions that tend to move. Note that the first SiNO film 112 and the second SiON film 131b can be formed by a method like a CVD method such as a plasma CVD method or a low-pressure CVD method, a sputtering method, or the like.

Here, it is preferable that a process for planarizing the surface of the second SiON film 131b be performed. For example, the surface of the SiON film can be planarized by a polishing process called chemical mechanical polishing (CMP). By planarization of the surface of the SiON film, the adhesion thereof to the single-crystal silicon substrate 110 to be bonded later can be increased.

Figure 2D:
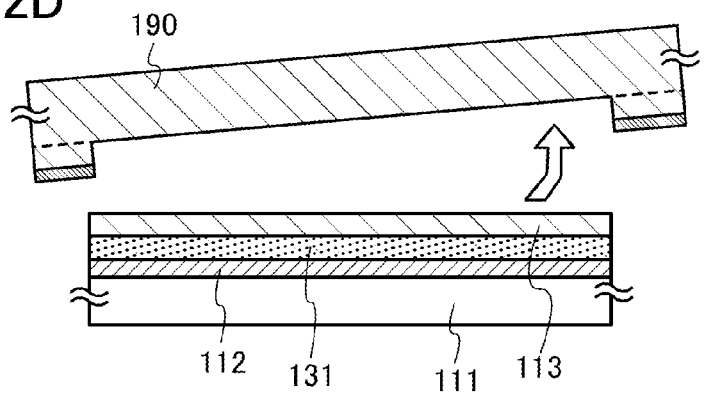

Next, heat treatment (first heat treatment) at 400° C. to 600° C. is performed. This heat treatment causes a change in the volume of microvoids in the hydrogen-containing layer 140 and generates a boundary surface along the hydrogen-containing layer 140. Accordingly, the single-crystal silicon substrate 110 is divided, and by removal of a single-crystal silicon substrate 190 obtained by the division, the first SiNO film 112, the third SiON film 131, and a single-crystal silicon layer 113 are left remaining over the first substrate 111 (FIG. 2D).

Next, a process for planarizing the surface of the single-crystal silicon layer 113 may be performed. The planarization process can be performed by a polishing process called chemical mechanical polishing (CMP).

Next, selective etching is performed using a photolithography technique or the like to form the frame 114 of a semiconductor material. At the time of this etching, the first SiNO film 112 functions as a protective film for the first substrate 111.

Figure 2E:
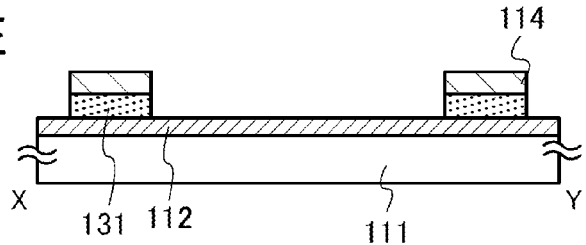

Through the above-described steps, the frame of this embodiment mode can be formed over the glass substrate (FIG. 2E). FIG. 2E corresponds to a cross section taken along a dotted line X-Y of FIG. 1B. In this embodiment mode, a bonding force for the bonding is given to the substrate surface and then the substrates are superposed on each other; thus, strong bonding can be performed without any high-temperature heat treatment being performed. Therefore, there is no need to use an expensive, highly heat-resistant substrate, and an inexpensive glass substrate, plastic substrate, or the like can be used: thus, manufacturing cost can be reduced. In addition, a flexible substrate which cannot withstand high-temperature treatment can also be used, and the range of choice for the sealing substrate can be expanded.

Although an example in which an SiON film and an SiNO film are stacked between a glass substrate and a single-crystal silicon layer is described in this embodiment mode, the present invention is not limited thereto. A single-layer structure using any one of a silicon oxide film (also called an SiO$_2$ film), a silicon nitride film (also called an SiN film), an SiON film, and an SiNO film may be employed or a structure in which a plurality of these films is stacked appropriately may be employed. Note that, in this specification, an SiON film means a film that contains more oxygen than nitrogen and can also be referred to as a nitrogen-containing silicon oxide film. In addition, in this specification, an SiNO film means a film that contains more nitrogen than oxygen and can also be referred to as an oxygen-containing silicon nitride film. For example, an SiON film may be formed over a single-crystal silicon substrate; an SiNO film may be formed over a glass substrate; and the single-crystal silicon substrate and the glass substrate may be bonded together with the SiON film and the SiNO film interposed therebetween. Alternatively, an SiNO film and an SiON film may be formed over a glass substrate in this order, and a single-crystal silicon substrate and the glass substrate may be bonded together with the SiON film and the SiNO film interposed therebetween. Still alternatively, an SiON film and an SiNO film may be formed over a single-crystal silicon substrate in this order, and the single-crystal silicon substrate and a glass substrate may be bonded together with the SiON film and the SiNO film interposed therebetween. Yet alternatively, an SiON film may be formed over a single-crystal silicon substrate; an SiNO film and an SiON film may be formed over a glass substrate in this order, and the single-crystal silicon substrate and the glass substrate may be bonded together by bonding of the SiON films to each other, or a silicon oxide film may be formed between the SiON film and the SiNO film by a CVD method or a plasma CVD method using a mixed gas of a TEOS gas and an oxygen gas.

Note that it is preferable that a silicon oxide film formed by a CVD method or a plasma CVD method using a mixed gas of a TEOS gas and an oxygen gas be provided at a bonding interface between a single-crystal silicon substrate and a glass substrate. For example, after an insulating layer of SiNO or the like is provided over a single-crystal silicon substrate, a silicon oxide film may be formed by a CVD method or a plasma CVD method using a mixed gas of a TEOS gas and an oxygen gas, and the silicon oxide film formed by a CVD method or a plasma CVD method using a mixed gas of a TEOS gas and an oxygen gas and a glass substrate may be bonded together. Alternatively, after an insulating layer of SiNO or the like is provided over a glass substrate, a silicon oxide film may be formed by a CVD method or a plasma CVD method using a mixed gas of a TEOS gas and an oxygen gas, and the silicon oxide film formed by a CVD method or a plasma CVD method using a mixed gas of a TEOS gas and an oxygen gas and a single-crystal silicon substrate may be bonded together. By provision of a silicon oxide film formed by a CVD method or a plasma CVD method using a mixed gas of a TEOS gas and an oxygen gas at a bonding interface, adhesion can further be increased. Note that, instead of a silicon oxide film formed by a CVD method or a plasma CVD method using a mixed gas of a TEOS gas and an oxygen gas, a silicon oxide film formed by a sputtering method or the like may be used.

Figure 1C:
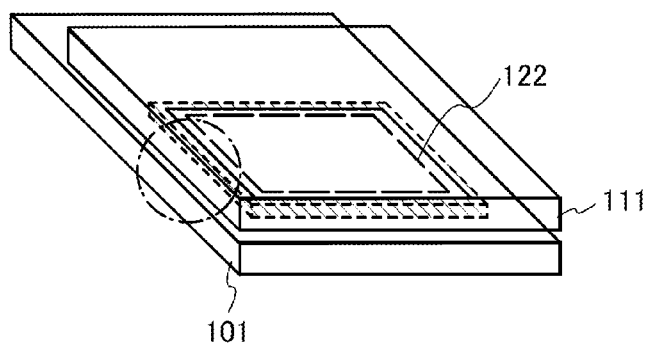
Figure 1D:
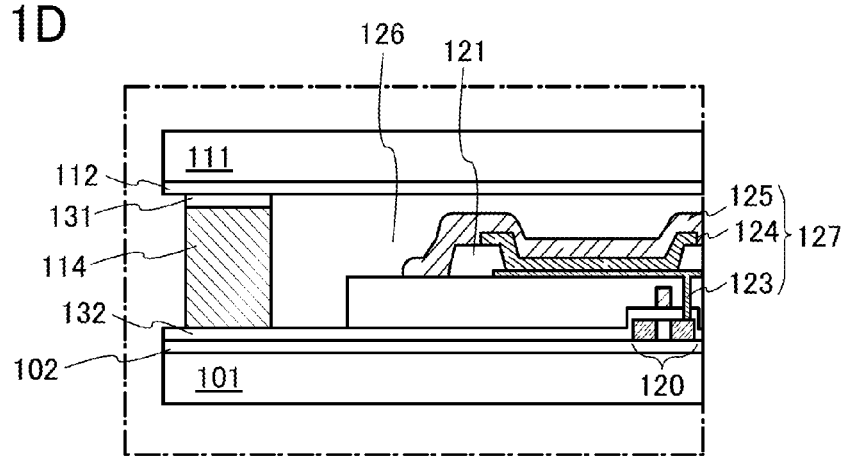

Next, as shown in FIG. 1C and FIG. 1D, the first substrate 111 provided with the frame 114 and a second substrate 101 provided with a pixel portion 122 are bonded together. If necessary, heat treatment for forming a further stronger bond is performed at a temperature lower than the strain point of the first substrate 111. As the second substrate 101, a glass substrate that has a thermal expansion coefficient equal to that of the first substrate 111 is used. For the frame 114, a semiconductor substrate that has a small difference in thermal expansion coefficient with respect to the first substrate 111 is used. In this embodiment mode, the frame 114 and the second substrate 101 are bonded together; therefore, a silicon oxide film 132 is formed between the frame 114 and the second substrate 101 by a CVD method or a plasma CVD method using a mixed gas of a TEOS gas and an oxygen gas.

FIG. 1D shows an example of a cross-sectional view of a portion surrounded by a chain line of FIG. 1C. The second substrate 101 is provided with a thin film transistor 120 and a light-emitting element 127 which is electrically connected to the thin film transistor 120. Note that the light-emitting element 127 has at least a first electrode 123, a light-emitting layer 124, and a second electrode 125. In the pixel portion 122, a plurality of light-emitting elements 127 is arranged in a matrix, and an insulating layer 121 is provided between each adjacent first electrode 123. Between a semiconductor layer of the thin film transistor 120 and the second substrate 101, a second SiNO film 102 is provided as a blocking film for preventing impurity diffusion from the second substrate 101 that is a glass substrate. In addition, a gate insulating film is provided over the semiconductor layer of the thin film transistor 120, and as this gate insulating film, the silicon oxide film 132 formed by a CVD method or a plasma CVD method using a mixed gas of a TEOS gas and an oxygen gas is used.

In this embodiment mode, a strong bond is formed by contact of the frame 114 and the silicon oxide film 132 with each other. A method for bonding the first substrate provided with frame 114 and the second substrate 101 provided with the pixel portion 122 to each other is not limited to that in which these substrates are bonded together at the interface between the frame 114 and the silicon oxide film 132. A silicon oxide film may be formed over the frame 114 by a CVD method or a plasma CVD method using a mixed gas of a TEOS gas and an oxygen gas and may be bonded to the silicon oxide film 132. Although FIG. 1D shows an example in which the second SiNO film 102 and the silicon oxide film 132 are stacked over the second substrate 101, the present invention is not limited thereto. A single-layer structure using any one of a silicon oxide film (also referred to as an SiO$_2$ film), a silicon nitride film (also referred to as an SiN film), an SiON film, and an SiNO film or a structure in which any of the above films are stacked as appropriate may be used.

A closed space 126 surrounded by the first substrate 111, the second substrate 101, and the frame 114 may be filled with an inert gas, may be a low-pressure space, or may be filled with a material liquid such as a silicone resin or the like.

Note that the distance between the pair of substrates is adjusted depending on the sum of the thickness of the second SiNO film 102, the silicon oxide film 132, the frame 114, the third SiON film 131, and the first SiNO film 112. The frame 114 is formed of single-crystal silicon, and the entire portion where the pair of substrates are fixed is formed of an inorganic material. Therefore, a hermetically sealed package which ensures long-term airtightness can be realized.

In particular, when a layer containing an organic compound, for example, a triplet compound is used as the light-emitting layer of the light emitting element, the intrusion of moisture or oxygen can also be prevented, and a light-emitting panel having improved long-term reliability can be provided. In addition, a long-lifetime light-emitting panel can also be provided when a layer containing an inorganic compound, for example, an inorganic thin film of ZnS:Mn is used as the light-emitting layer of the light-emitting element.

Although an example of an active-matrix light-emitting device is described in this embodiment mode, the present invention is not limited thereto and can be applied to a sealing structure for a passive-matrix light-emitting device.

Embodiment Mode 2

In this embodiment mode, an example of a liquid crystal display device is described with reference to FIGS. 3A and 3B, in which a thin film transistor 320 using an amorphous silicon layer is placed in a pixel portion 394 and a signal line driver circuit 391 or a scan line driver circuit 392 or 393 which drives the thin film transistor is formed inside a semiconductor substrate.

Figure 3A:
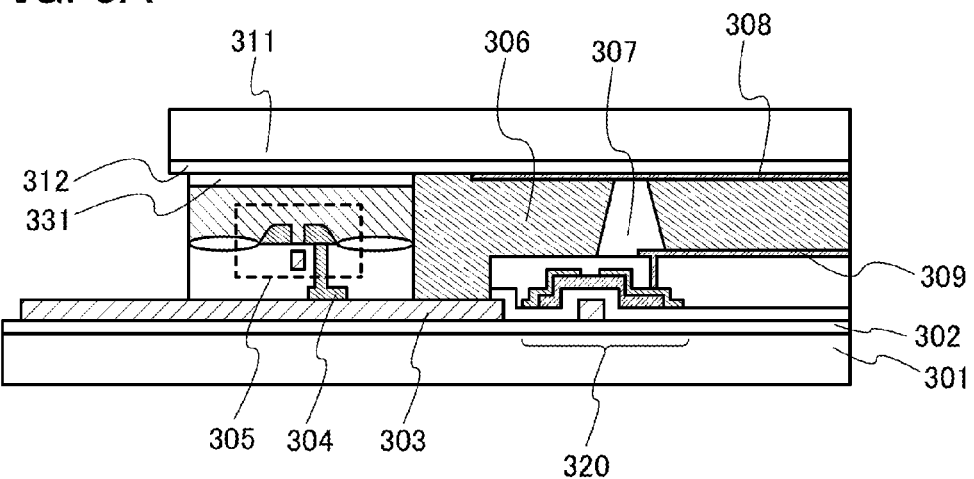
FIGS. 3 A and 3B are a cross-sectional view of a liquid crystal display device and a top view thereof, respectively.

FIG. 3A shows a cross-sectional view of a liquid crystal display device, which performs display by application of voltage to a liquid crystal layer 306 between a pixel electrode 309 and a counter electrode 308.

First, a semiconductor substrate where a MOS transistor 305 is formed is prepared, and the semiconductor substrate where the MOS transistor 305 is formed is bonded to a first substrate 311 by a separation method by hydrogen ion irradiation. A bonding layer 312 formed on the first substrate 311 and a bonding layer 331 formed on the semiconductor substrate are bonded together. Note that the bonding layers 312 and 331 may be formed using any of the inorganic insulating materials described in Embodiment Mode 1. As the first substrate 311, a glass substrate is used.

A wiring layer 303 is a wiring layer which is connected to an FPC 390. Note that, in order to electrically connect the MOS transistor to the wiring layer 303, the MOS transistor is polished by a CMP process until the surface of an electrode 304 of the MOS transistor is exposed after the bonding layer is formed.

Figure 3B:
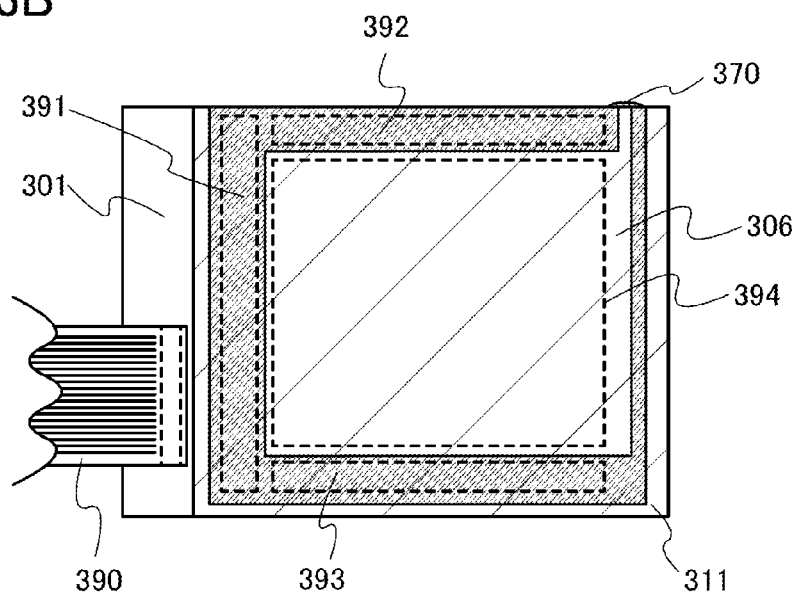

Next, the semiconductor substrate is etched into a shape shown in FIG. 3B.

After that, the polished surface of the semiconductor substrate and a bonding layer 302 of a second substrate 301 are located in contact with each other and thereby bonded together to electrically connect the wiring layer 303 to the electrode 304 of the MOS transistor 305. Note that the bond is formed between the polished surface and the bonding layer 302 of the second substrate 301, not between the wiring layer 303 and the electrode 304. Note that the bonding layer 302 may be formed using any of the inorganic insulating materials described in Embodiment Mode 1.

As the second substrate 301, a glass substrate is used, and the thin film transistor 320 using an amorphous silicon layer is formed by a known method.

FIG. 3B is a top view of the liquid crystal display device. The pixel portion 394 is surrounded by a semiconductor member; the semiconductor member has an opening as shown in FIG. 3B; and this opening is a liquid crystal inlet. After the injection of a liquid crystal material is completed, sealing is performed using a sealant 370 of an organic material.

In addition, the distance between the pair of substrates may be ensured by a columnar spacer 307.

In this embodiment mode, the number of components is reduced by reduction of the usage of the sealant 370 of an organic material to a small amount and by building of a driver circuit in a member for bonding the pair of substrates.

This embodiment mode can be freely combined with Embodiment Mode 1.

Embodiment Mode 3

Figure 4A:
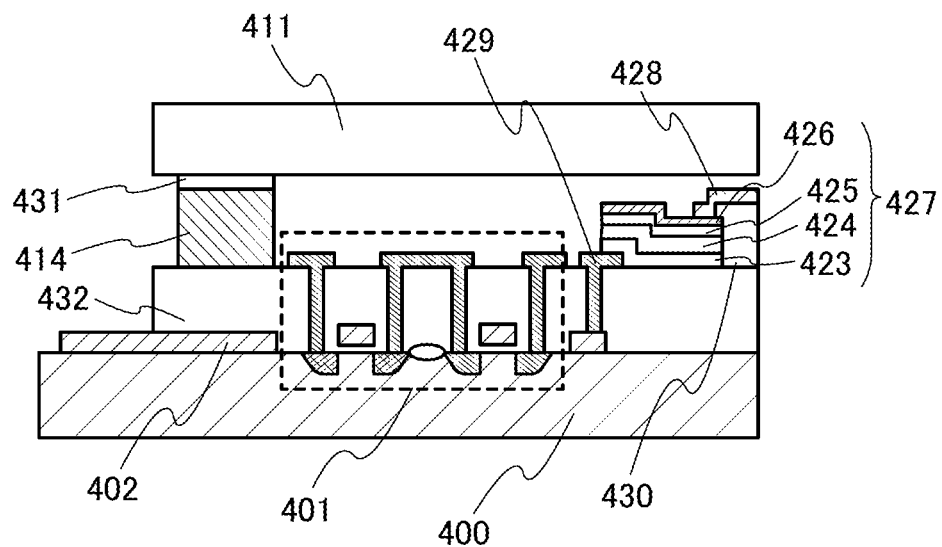
FIGS. 4A and 4B are a cross-sectional view of a semiconductor device having a light-receiving portion and a top view thereof, respectively.
Figure 4B:
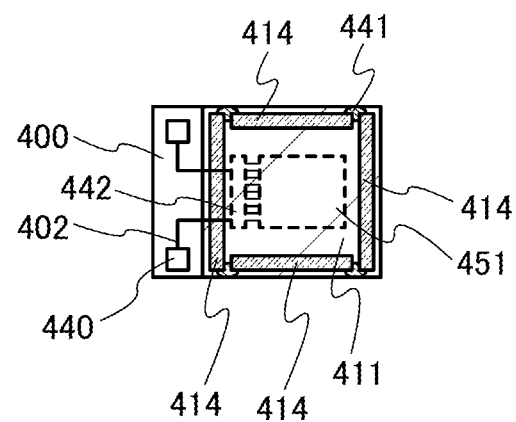

In this embodiment mode, an example is described in which a light-receiving element 427 provided over a semiconductor substrate is sealed using a sealing substrate 411 having a light-transmitting property. FIG. 4A is a cross-sectional view, and FIG. 4B is a top view.

A semiconductor substrate 400 is provided with a driver circuit 442 including a CMOS circuit 401, and the CMOS circuit 401 constitutes a part of an amplifier circuit for amplifying light that is received by the light-receiving element 427. Note that an interlayer insulating film for the CMOS circuit 401 is formed as a bonding layer 432. The interlayer insulating film may have a stacked-layer structure as long as a layer in contact with a semiconductor member 414 functions as a bonding layer.

The light-receiving element 427 has a photoelectric layer, which includes a p-type semiconductor layer 423, an n-type semiconductor layer 425, an i-type (intrinsic) semiconductor layer 424 which is interposed between the p-type semiconductor layer 423 and the n-type semiconductor layer 425, a first electrode 429, and a second electrode 426. As a photoelectric element, not only this stacked-layer structure but also a Schottky diode, a PN diode, an avalanche diode, or the like can be used.

The second electrode 426 is electrically connected to a wiring layer 402 through a lead wiring 428. The wiring layer 402 is electrically connected to a connection terminal 440.

The semiconductor substrate 400 having the light-receiving element of the above structure is prepared.

Then, stick semiconductor members 414 are bonded to the sealing substrate 411. The stick semiconductor members 414 are bonded to the sealing substrate 411 by use of a bonding layer 431 formed thereon. The bonding layer 431 is a silicon oxide film formed by a CVD method or a plasma CVD method using a mixed gas of a TEOS gas and an oxygen gas.

Then, the bonding layer 432 of the semiconductor substrate 400 having the light-receiving element and the stick semiconductor members 414 are bonded together to bond the semiconductor substrate 400 and the sealing substrate 411 together. After this, a space between each stick semiconductor member 414 is sealed using a sealant 441. Although an example of performing hermetic sealing is given here, the sealant does not necessarily need to be provided. As shown in FIG. 4B, the plurality of stick semiconductor members 414 is placed in a position where a light-receiving portion 451 in which the light-receiving elements 427 are arranged in a matrix does not overlap with the driver circuit 442. Note that an insulating layer 430 for insulating adjacent light-receiving elements from each other may be provided.

The stick semiconductor members 414 can maintain the distance to the sealing substrate 411 and prevent contamination of the light-receiving element by an impurity. In addition, when pressure is applied from the outside due to some cause, the stick semiconductor members 414 can prevent the pressure from being applied to the light-receiving element and can distribute the pressure. In particular, when the light-receiving element is mounted on a printed wiring board or the like, in some cases, a force of about 30 N is applied during pressure bonding. However, the stick semiconductor members 414 can prevent the semiconductor substrate 400 and the sealing substrate 411 from breaking and can protect the light-receiving element during mounting. When a semiconductor substrate provided with a plurality of light-receiving elements and a sealing substrate that are bonded together are cut by a dicer or the like in a step of dividing the plurality of light-receiving elements into pieces, the light-receiving elements can also be protected.

Although an example of using a semiconductor substrate having a light-receiving element is given here, a light-receiving element may be formed over a glass substrate, and the glass substrate and another glass substrate may be fixed to each other using stick semiconductor members. In that case, after a semiconductor substrate having a hydrogen-containing layer is bonded to the other glass substrate, one part of the semiconductor substrate is separated from the other, and then, selective etching is performed to leave stick semiconductor members remaining over the glass substrate. The glass substrate having the stick semiconductor members obtained in the above-mentioned manner may be bonded to the glass substrate provided with the light-receiving element. When a glass substrate that is fragile is used, the glass substrate can be prevented from breaking by making the stick semiconductor members function as spacers.

This embodiment mode can be freely combined with Embodiment Mode 1 or Embodiment Mode 2.

Embodiment Mode 4

Figure 5A:
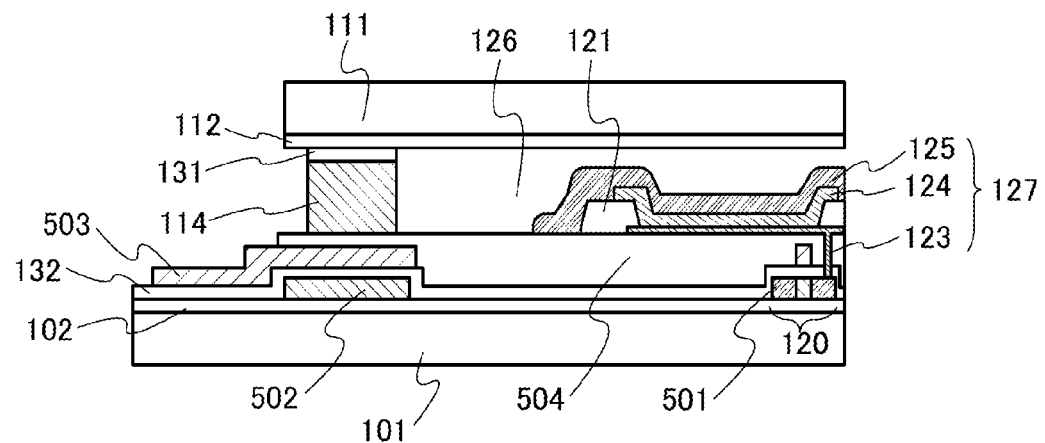
FIGS. 5A and 5B are a cross-sectional view of a semiconductor device and a top view thereof, respectively.
Figure 5B:
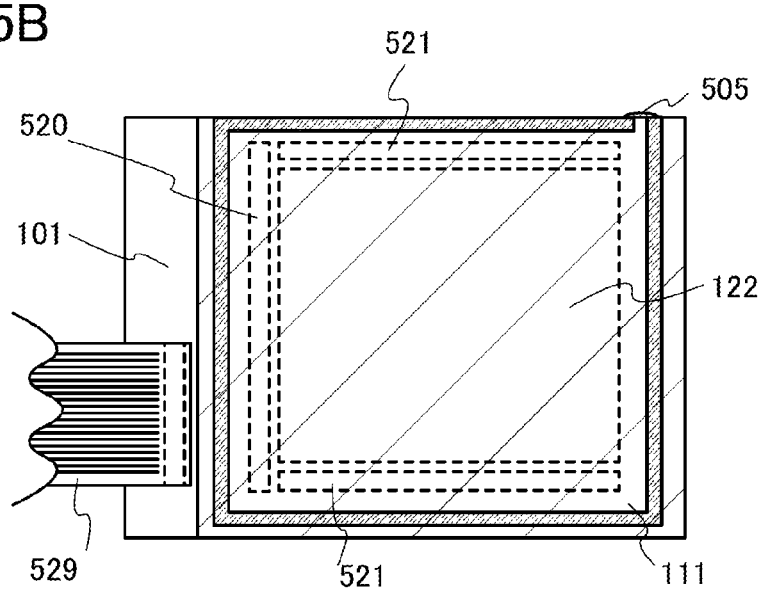

In this embodiment mode (FIGS. 5A and 5B), an example is described in which a single-crystal semiconductor member 502 is formed in a position where it does not overlap with the pixel portion 122 in the same step as formation of a single-crystal semiconductor layer 501 over a second substrate 101 by a separation method by hydrogen ion irradiation or the like in order to adjust the distance between the substrates. In FIGS. 5A and 5B, portions in common with those in FIG. 1D are denoted by the same reference numerals.

The frame 114 is bonded so as to overlap with the single-crystal semiconductor member 502. Note that, as shown in FIG. 5B, the frame 114 has an opening, which is sealed using a sealant 505. A bonding layer 504 for bonding the second substrate 101 and the frame together is an interlayer insulating film for the thin film transistor 120. A wiring layer 503 is formed in the same step as formation of a gate electrode of the thin film transistor 120 and is electrically connected to an FPC 529.

A signal line driver circuit 520 and a scan line driver circuit 521 are provided around the pixel portion 122, and the frame 114 is bonded so as to surround these.

This embodiment mode can be freely combined with any of Embodiment Modes 1 to 3.

Embodiment Mode 5

Figure 6:
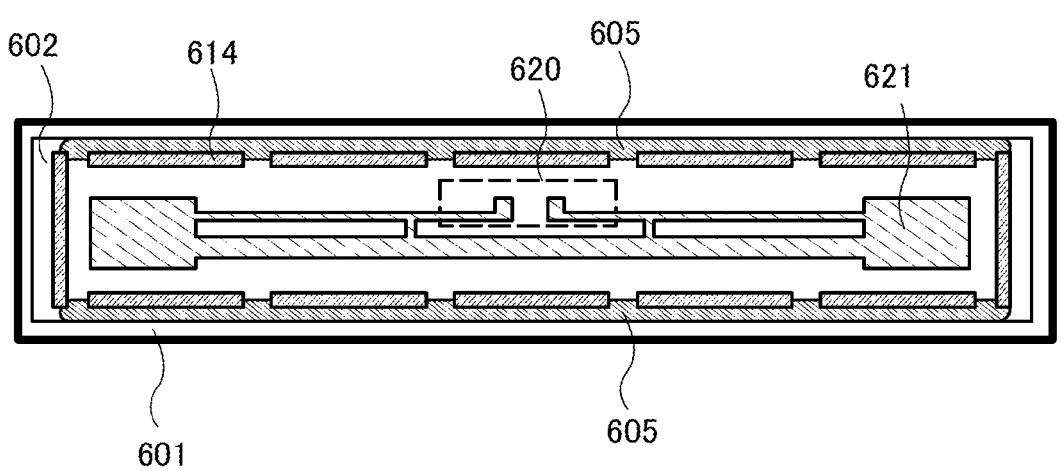
FIG. 6 is a top view of a semiconductor device.

In this embodiment mode, an example of a semiconductor device having an antenna is described with reference to FIG. 6. The semiconductor device shown in FIG. 6 is also called a wireless chip. For a wireless chip, not only a light-transmitting substrate but also paper or a colored filter can be used.

FIG. 6 is a top view showing a structure in which an antenna 621 is surrounded by stick semiconductor members 614 and a space between each of them is sealed using a sealant 605. The antenna 621 and an integrated circuit 620 are formed over a second substrate 601. The second substrate 601 is a glass substrate. In addition, a first substrate 602 serving as a sealing substrate is also a glass substrate.

In the case where the antenna is formed by plating or the like, although it depends on the antenna material, when a material which is likely to react with oxygen or the like to deteriorate or a material which reacts with oxygen to increase its electric resistance is used, the antenna is preferably sealed in a hermetic space surrounded by the pair of substrates and the semiconductor members 614 as shown in FIG. 6.

The antenna 621 is electrically connected to the integrated circuit 620. The integrated circuit 620 has at least a power supply circuit which generates various kinds of power to be supplied to circuits in the semiconductor device based on an AC signal which is input from the antenna 621.

The shape of the antenna 621 is not limited to that shown in FIG. 6. As a signal transmission method used for the antenna, an electromagnetic coupling method, an electromagnetic induction method, a microwave method, or the like can be used. The transmission method may be appropriately selected by a practitioner in consideration of the application, and an antenna having a length and a shape that are most suitable for the selected transmission method may be provided.

In the case of employing, for example, an electromagnetic coupling method or an electromagnetic induction method (for example, a 13.56 MHz band) as the transmission method, electromagnetic induction caused by a change in magnetic field density is used. Thus, a conductive film which functions as an antenna is formed into an annular shape (for example, a loop antenna) or a spiral shape (for example, a spiral antenna).

In the case of employing, for example, a microwave method (for example, a UHF band (860 to 960 MHz band) or a 2.45 GHz band) as the transmission method, the length and shape of a conductive film which functions as an antenna may be appropriately set in consideration of the wavelength of an electric wave used for signal transmission. The conductive film which functions as an antenna can be formed into, for example, a linear shape (for example, a dipole antenna), a flat shape (for example, a patch antenna), or the like. The shape of the conductive film which functions as an antenna is not limited to a linear shape and may be a curved shape, a meandering shape, or a combination thereof in consideration of the wavelength of an electromagnetic wave.

Because a glass substrate is a substrate that does not block a wireless signal, the antenna can also transmit and receive electric waves in various directions besides a plane where the antenna is formed.

In addition, it is preferable that a glass substrate and a semiconductor member that have a small difference in thermal expansion coefficient with respect to each other be used to increase reliability of a semiconductor device. This is because, if there is a large difference in thermal expansion coefficient between them and the semiconductor device is placed in an environment at high temperature or low temperature, the adhesion between the pair of substrates may be decreased.

The stick semiconductor members 614 can maintain the distance between the first substrate 602 and the second substrate 601 and can prevent contamination of the integrated circuit and the antenna by an impurity. By placement of a single-crystal semiconductor member around the integrated circuit, an impurity from the outside is made to intrude preferentially into the single-crystal semiconductor member and to be retained in the single-crystal semiconductor member; accordingly, the intrusion of an impurity into a semiconductor layer of the integrated circuit is prevented. By prevention of the intrusion of an impurity into the semiconductor layer of the integrated circuit, long-term reliability is improved. In addition, when pressure is applied from the outside due to some cause, the plurality of stick semiconductor members 614 can decrease the pressure that is applied to the integrated circuit and the antenna and can distribute the pressure. When high impact is applied due to pressure from the outside, the semiconductor members 614 may be destroyed before the integrated circuit is destroyed. However, because the impact is concentrated on the semiconductor members 614, the pressure is distributed and the semiconductor device can function as a wireless chip even after the impact is applied unless the integrated circuit is damaged. Note that there is no problem even if the semiconductor members 614 are destroyed because no electrode, wiring, element, or the like is provided inside or on the surface of the semiconductor members 614.

The position alignment of the integrated circuit and the stick semiconductor members 614 with each other is important. This is because, if any of the stick semiconductor members and the integrated circuit overlap with each other, pressure from the outside may be applied to the integrated circuit through the stick semiconductor member and the integrated circuit may be destroyed.

Figure 8A:
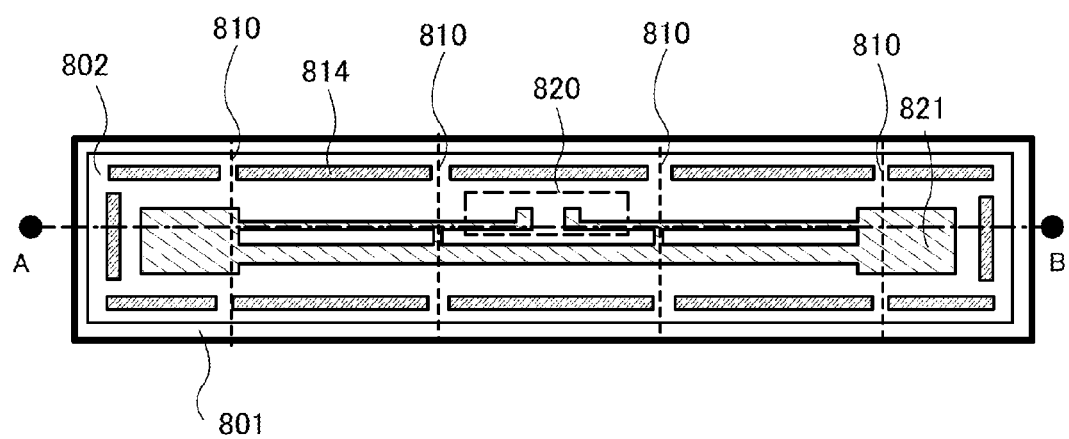
FIGS. 8A and 8B are a top view of a semiconductor device and a cross-sectional view thereof, respectively.
Figure 8B:
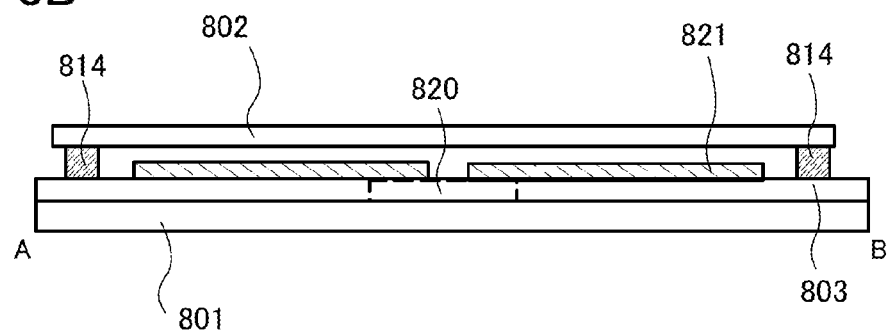

Although FIG. 6 shows an example in which glass substrates are used as the pair of substrates, films can alternatively be used. FIGS. 8A and 8B show an example in which films are used as a first substrate 802 and a second substrate 801.

FIG. 8A is a top view, and FIG. 8B is a cross-sectional view taken along a chain line A-B of FIG. 8A.

Over the second substrate 801, an integrated circuit 820 and an insulating film 803 are formed, and an antenna 821 is electrically connected to the integrated circuit 820. Because a connecting portion between the antenna 821 and the integrated circuit 820 is sensitive to pressure from the outside or to film bending, the connecting portion is reinforced by placement of stick semiconductor members 814 therearound. In addition, because a wireless chip is attached to a curved surface in some cases, a portion 810 which is designed to be bendable (portion indicated by a dotted line in FIG. 8A) is provided in a space between each of the plurality of semiconductor members. Accordingly, the wireless chip shown in FIG. 8A is bent preferentially in the portion indicated by the dotted line, and the degree of bending of the integrated circuit can be reduced. The antenna may also be disconnected due to bending; however, as shown in FIG. 8A, the shape and placement of the antenna are designed so that the antenna is not easily disconnected even if the antenna is bent in the portion indicated by the dotted line.

In particular, when films are used, a manufacturing apparatus using a roller is often used, and there is a process in which films are sandwiched between two rollers during pressure bonding. Alternatively, paper can be used. When a flexible film or paper is used, stick semiconductor members serve as skeletal members. Therefore, if pressure is applied from the outside, the degree of bending of the film or paper can be reduced. As a result, the integrated circuit can be prevented from being destroyed.

Although FIGS. 5A and 8B show an example in which no sealant is used, an adhesive synthetic film may be used as the first substrate 802. After the integrated circuit, the antenna, and the stick semiconductor members are formed over the second substrate, sealing may be performed by pressure bonding of the first substrate 802 that is an adhesive synthetic film with rollers. In this case, because pressure from the rollers is concentrated on the stick semiconductor members, the integrated circuit and the antenna can be protected.

This embodiment mode can be freely combined with any of Embodiment Modes 1 to 4.

Embodiment Mode 6

Various electronic devices can be manufactured by building of semiconductor elements sealed according to the present invention therein. Examples of electronic devices include cameras such as video cameras and digital cameras, goggle-type displays (head-mounted displays), projectors, navigation systems, sound reproducing devices (such as car audio systems and audio components), notebook personal computers, game machines, portable information terminals (such as mobile computers, cellular phones, portable game machines, and electronic books), image reproducing devices each provided with a recording medium (specifically, devices including a display which can reproduce a recording medium such as a digital versatile disc (DVD) and can display an image thereof), and the like.

An example is given in which an optical sensor including the light-receiving element described in Embodiment Mode 3 is built in an information terminal device typified by a cellular phone or a PDA. In addition, an example is given in which the light-emitting element described in Embodiment Mode 1 or the liquid crystal element described in Embodiment Mode 2 is build in a display portion as a display element.

In these years, the amount of power consumed by a lighting device such as a backlight tends to increase because of color display or an increase in quality of moving images of an information device such as a cellular phone or a PDA. On the other hand, a reduction in power consumption has been demanded without deterioration of display quality. Consequently, the amount of power consumption is reduced by control of the luminance of a display device or by control of lighting of a key switch by means of sensing of the illuminance in an environment where an information device is used.

Figure 7A:
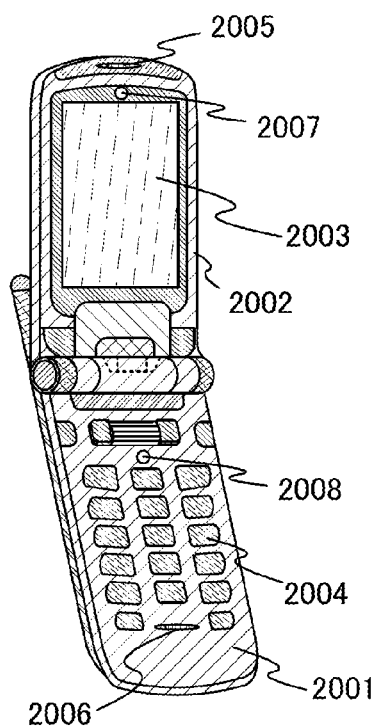
FIGS. 7A to 7C are diagrams showing examples of electronic devices.

FIG. 7A shows a cellular phone, which has a main body 2001, a chassis 2002, a display portion 2003, an operation key 2004, an audio output portion 2005, an audio input portion 2006, optical sensor portions 2007 and 2008, and the like. The present invention can be applied to the display portion 2003 or the optical sensor portions 2007 and 2008. By control of the luminance of the display portion 2003 based on the illuminance obtained by the optical sensor portion 2007 or by control of lighting of the key switch 2004 based on the illuminance obtained by the optical sensor portion 2008, the amount of power consumed by the cellular phone can be reduced.

In an image-taking device such as a digital camera or a digital video camera, a visible light detection sensor is provided in the vicinity of an eyepiece portion (viewfinder) of an optical viewfinder to detect whether or not a person taking a picture looks through the optical viewfinder. For example, the detection is performed utilizing the fact that, when the face of a person taking a picture approaches the viewfinder eyepiece portion, the eyepiece portion and its vicinity are in the shadow of the person taking a picture and the amount of light received by the sensor changes.

Figure 7B:
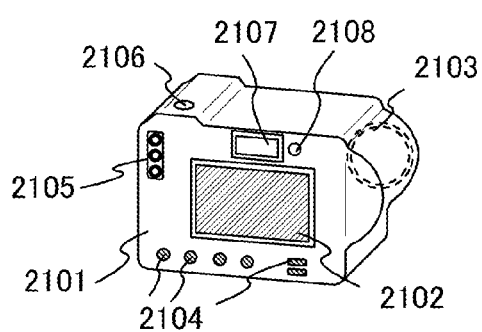

FIG. 7B shows a digital camera, which has a main body 2101, a display portion 2102, an image receiving portion 2103, an operation key 2104, an external connection port 2105, a shutter button 2106, a viewfinder 2107, an optical sensor portion 2108, and the like. The present invention can be applied to the display portion 2102 or the optical sensor portion 2108. Whether or not a person taking a picture looks through an optical viewfinder is detected based on a change in the amount of light received by a sensor in the optical sensor portion 2108 which is provided in the vicinity of the viewfinder 2107. The amount of power consumption can be reduced by turning off the display portion 2102 when a person taking a picture looks through the optical viewfinder.

In addition, an optical sensor element can be used for the purpose of adjustment of projector convergence.

A television device can be completed with a semiconductor device including a display element which has a sealing structure enhanced by the present invention. An example of a television device intended to have high performance and high reliability is described with reference to FIG. 7C.

By building of a display module in a chassis, a television device can be completed. A display panel in which components up to an FPC are provided as shown in FIG. 5B is generally also called an EL display module. When an EL display module as shown in FIG. 5B is used, an EL television device can be completed, and when a liquid crystal display module as shown in FIG. 3B is used, a liquid crystal television device can be completed. Using a display module, a main screen 2203 can be formed, and other accessories such as speaker portions 2209 and operation switches are provided. In this manner, a television device can be completed according to the present invention.

Figure 7C:
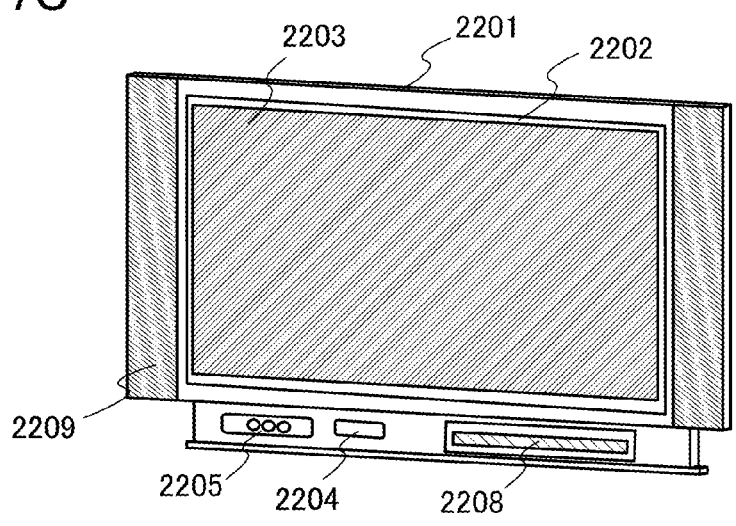
Figure 7C:
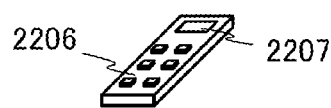

As shown in FIG. 7C, a display panel 2202 using a display element is built in a chassis 2201. In addition to reception of general TV broadcast with the use of a receiver 2205, communication of information can also be performed in one way (from a transmitter to a receiver) or in two ways (between a transmitter and a receiver or between receivers) by connection to a wired or wireless communication network through a modem 2204. The television device can be operated with switches built in the chassis or with a remote control device 2206 separated from the main body. This remote control device may also be provided with a display portion 2207 that displays information to be output. In addition, the receiver 2205 may be provided with the wireless chip described in Embodiment Mode 5. By building of the wireless chip in the receiver 2205, the manufacturing date can be recognized accurately. In addition, by building of the wireless chip in the receiver 2205, it is also possible to determine, using a wireless signal, which area a product in which the receiver 2205 is built in is located in. In addition, by building of a wireless chip in the receiver 2205, the television device may be operated using a wireless signal for a signal from the remote control device 2206.

In addition, for the television device, a structure for displaying a channel, sound volume, or the like may be additionally provided by formation of a sub-screen 2208 with a second display panel in addition to the main screen 2203. In this structure, the main screen 2203 may be formed using an EL display panel which has excellent viewing angle, and the sub-screen 2208 may be formed using a liquid crystal display panel which can perform display while consuming less power. In order to prioritize a reduction in power consumption, a structure in which the main screen 2203 is formed using a liquid crystal display panel, the sub-screen 2208 is formed using an EL display panel, and the sub-screen can be turned on and off may be employed.

According to the present invention, a semiconductor device having a display function with high performance and high reliability can be manufactured. Accordingly, a high-performance, high-reliability television device can be manufactured.

This embodiment mode can be freely combined with any of Embodiment Modes 1 to 5.

This application is based on Japanese Patent Application serial No. 2007-133554 filed in Japan Patent Office on May 18, 2007, the entire contents of which are hereby incorporated by reference.

What is claimed is:

1. A semiconductor device comprising:
a first substrate;
a semiconductor element over the first substrate;
a first structure, a second structure and a third structure over the first substrate;
a first sealant between the first structure and the second structure;
a second sealant extending in parallel with the first sealant; and
a second substrate over the semiconductor element, the first structure, the second structure, the third structure, the first sealant and the second sealant,
wherein the first sealant comprises an organic material,
wherein a portion of the first substrate is configured to be bent,
wherein the first structure and the second structure are spaced from each other with a gap provided over the portion,
wherein each of the first structure and the second structure has a stick shape extending in a line in a first direction,
wherein the third structure has a stick shape extending in a line in a second direction,
wherein the first direction is vertical to the second direction,
wherein the first structure comprises a first surface and a second surface opposite to the first surface,
wherein the first surface faces the semiconductor element, and
wherein the first sealant and the second sealant are spaced from each other with a gap.

2. The semiconductor device according to claim 1, wherein each of the first substrate and the second substrate is a plastic substrate.

3. The semiconductor device according to claim 1, wherein the first sealant is provided over the portion.

4. The semiconductor device according to claim 1, wherein the semiconductor element is sealed in a space surrounded by the first substrate, the first structure, the second structure, the third structure and the second substrate.

5. The semiconductor device according to claim 1, wherein each of the first structure and the second structure comprises a semiconductor.

6. The semiconductor device according to claim 1, wherein a concentration of alkali metal in each of the first structure and the second structure is higher than a concentration of alkali metal in the semiconductor element.

7. A semiconductor device comprising:
a first flexible substrate;
a semiconductor element over the first flexible substrate;
a first structure, a second structure and a third structure over the first flexible substrate;
a first sealant between the first structure and the second structure;

a second sealant extending in parallel with the first sealant; and a second flexible substrate over the semiconductor element, the first structure, the second structure, the third structure, the first sealant and the second sealant, wherein the first sealant comprises an organic material, wherein a portion of the first flexible substrate is configured to be bent, wherein the first structure and the second structure are spaced from each other with a gap provided over the portion, wherein each of the first structure and the second structure has a stick shape extending in a line in a first direction, wherein the third structure has a stick shape extending in a line in a second direction, wherein the first direction is vertical to the second direction, wherein the first structure comprises a first surface and a second surface opposite to the first surface, wherein the first surface faces the semiconductor element, and wherein the first sealant and the second sealant are spaced from each other with a gap.

8. The semiconductor device according to claim 7, wherein each of the first flexible substrate and the second flexible substrate is a plastic substrate.

9. The semiconductor device according to claim 7, wherein the first sealant is provided over the portion.

10. The semiconductor device according to claim 7, wherein the semiconductor element is sealed in a space surrounded by the first flexible substrate, the first structure, the second structure, the third structure and the second flexible substrate.

11. The semiconductor device according to claim 7, wherein each of the first structure and the second structure comprises a semiconductor.

12. The semiconductor device according to claim 7, wherein a concentration of alkali metal in each of the first structure and the second structure is higher than a concentration of alkali metal in the semiconductor element.

13. A semiconductor device comprising:
a first flexible substrate;
an inorganic insulating layer over the first flexible substrate;
a semiconductor element over the inorganic insulating layer;
a first structure, a second structure and a third structure over the inorganic insulating layer;
a first sealant between the first structure and the second structure;
a second sealant extending in parallel with the first sealant; and
a second flexible substrate over the semiconductor element, the first structure, the second structure, the third structure, the first sealant and the second sealant, wherein the first sealant comprises an organic material, wherein a portion of the first flexible substrate is configured to be bent, wherein the first structure and the second structure are spaced from each other with a gap provided over the portion, wherein each of the first structure and the second structure has a stick shape extending in a line in a first direction, wherein the third structure has a stick shape extending in a line in a second direction, wherein the first direction is vertical to the second direction, wherein the first structure comprises a first surface and a second surface opposite to the first surface, wherein the first surface faces the semiconductor element, and wherein the first sealant and the second sealant are spaced from each other with a gap.

14. The semiconductor device according to claim 13, wherein each of the first flexible substrate and the second flexible substrate is a plastic substrate.

15. The semiconductor device according to claim 13, wherein the first sealant is provided over the portion.

16. The semiconductor device according to claim 13, wherein the semiconductor element is sealed in a space surrounded by the first flexible substrate, the first structure, the second structure, the third structure and the second flexible substrate.

17. The semiconductor device according to claim 13, wherein each of the first structure and the second structure comprises a semiconductor.

18. The semiconductor device according to claim 13, wherein a concentration of alkali metal in each of the first structure and the second structure is higher than a concentration of alkali metal in the semiconductor element.

* * * * *